United States Patent [19]
Pietrobon

[11] Patent Number: 6,008,972
[45] Date of Patent: *Dec. 28, 1999

[54] SHORT CIRCUIT PROTECTION CIRCUIT FOR A LOW-SIDE DRIVER CIRCUIT

[75] Inventor: Giovanni Pietrobon, Novi, Mich.

[73] Assignee: STMicroelectronics, Inc., Carrollton, Tex.

[*] Notice: This patent is subject to a terminal disclaimer.

[21] Appl. No.: 08/854,667

[22] Filed: May 12, 1997

Related U.S. Application Data

[63] Continuation of application No. 08/539,732, Oct. 5, 1995, Pat. No. 5,696,658.

[51] Int. Cl.[6] .................................................... H02H 3/00
[52] U.S. Cl. ........................... 361/93.1; 361/18; 361/100; 361/115
[58] Field of Search .............................. 361/93, 115, 100, 361/18, 93.1

[56] References Cited

U.S. PATENT DOCUMENTS

| | | | |
|---|---|---|---|
| 3,668,483 | 6/1972 | Kellenbenz | 317/335 SC |
| 4,777,387 | 10/1988 | Collins | 307/270 |
| 5,128,553 | 7/1992 | Nelson | 307/253 |
| 5,696,658 | 12/1997 | Pietrobon | 361/31 |

*Primary Examiner*—Stephen W Jackson
*Attorney, Agent, or Firm*—Theodore E. Galanthay; Lisa K. Jorgenson; Andre Szuwalski

[57] ABSTRACT

A short circuit protection circuit which has a first short circuit protection circuit in parallel with a second short circuit protection circuit is disclosed. The first short circuit protection circuit includes a sense resistor and a comparator for detecting the short circuit, and a transistor and current source for turning off the low side driver when the short circuit is detected. The second short circuit protection circuit includes a current mirror, zener diode, transistor, and current source connected in series. The second short circuit protection circuit is in parallel with the first short circuit protection circuit. The second short circuit protection circuit accelerates the turn-off of the low-side driver with out affecting the stability of the circuit.

22 Claims, 1 Drawing Sheet

SHORT CIRCUIT PROTECTION CIRCUIT FOR A LOW-SIDE DRIVER CIRCUIT

This application is a continuation of application Ser. No. 08/539,732, filed Oct. 5, 1995 now U.S. Pat. No. 5,646,658.

BACKGROUND OF THE INVENTION

1. Field of the Invention

This invention relates to electronic circuits, and more specifically to short circuit protection circuits, and still more specifically to short circuit protection circuits used to protect a low-side driver transistor.

2. Description of the Relevant Art

The problem addressed by this invention is encountered in short circuit protection circuits which are used to protect power transistors such as the power transistors used to drive inductive loads. FIG. 1, for example, shows power transistors 9 and 10 driving the inductive load 14. Inductive load 14 is the schematic representation of the stator coils, arranged in a wye configuration, of a DC motor. Power transistor 9 is the high-side driver for coil 14A. Similarly, power transistor 10 is the low-side driver for coil 14B. It is understood be persons skilled in the art that the circuitry necessary to run the DC motor is not shown in FIG. 1.

Under normal conditions, the current through the low-side driver is limited because of the impedance of the stator coils. However, stator coils can fail in a manner which short circuits node 13 to a high voltage. The problem addressed by this invention occurs in trying to protect the low side driver 10 from excessive current when pin 13 has been short-circuited to a high voltage.

FIG. 1 illustrates the prior art short circuit protection circuit for the low-side driver 10. In this circuit, a short circuit on node 13 will cause an excessive current through the drain-source channel of low-side driver 10 and through sense resistor 12. The excessive current will increase the voltage drop across sense resistor 12. When the voltage drop across sense resistor 12 exceeds the reference voltage Vref, the output of comparator 4 will change from a low voltage to a high voltage thereby turning on transistor 6. Consequently, current source 8 draws current from the gate of low side driver 10 since current source 8 is larger than current source 2. Thus, transistor 10 is turned off at a controlled slew defined by the difference between current source 2 and current source 8. The slew rate is designed to optimize the response time and yet maintain stability, as is known in the art. However, current source 8, by necessity to add stability to the circuit, slows down the response time of the short circuit protection circuit.

Therefore, it is an object of the invention to provide a stable short circuit protection circuit which has improved response time. It is another object of the invention to improve the response time of the short circuit protection circuit with out changing the stability of the circuit. This and other objects, features, and advantages of the invention will be apparent to those skilled in the art from the following detailed description of the invention, when read with the drawings and appended claims.

SUMMARY OF THE INVENTION

The invention can be summarized as a short circuit protection circuit which has a first short circuit protection circuit in parallel with a second short circuit protection circuit. The first short circuit protection circuit includes a sense resistor and a comparator for detecting the short circuit, and a transistor and current source for turning off the low side driver when the short circuit is detected. The second short circuit protection circuit includes a current mirror, zener diode, transistor, and current source connected in series. The second short circuit protection circuit is in parallel with the first short circuit protection circuit. The second short circuit protection circuit accelerates the turn-off of the low-side driver with out affecting the stability of the circuit.

DETAILED DESCRIPTION OF THE PREFERRED EMBODIMENT

Figure 1:
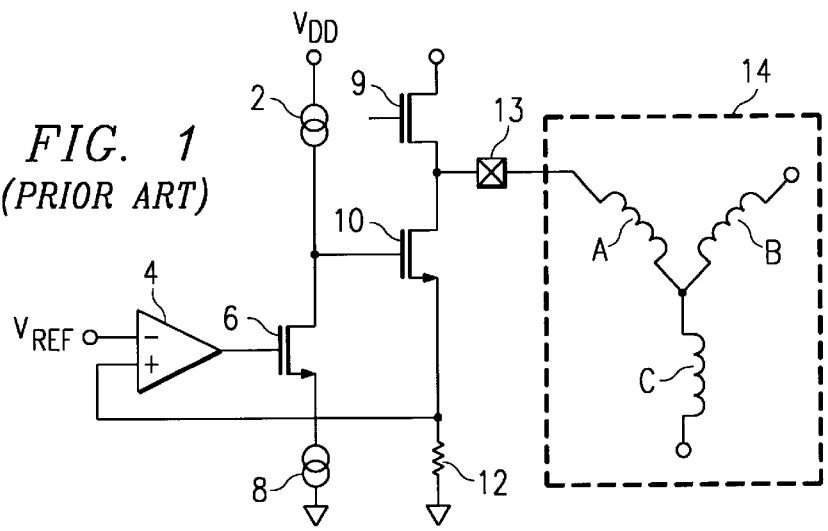
FIG. 1 is a low-side driver circuit with short circuit protection, as is known in the prior art.
Figure 2:
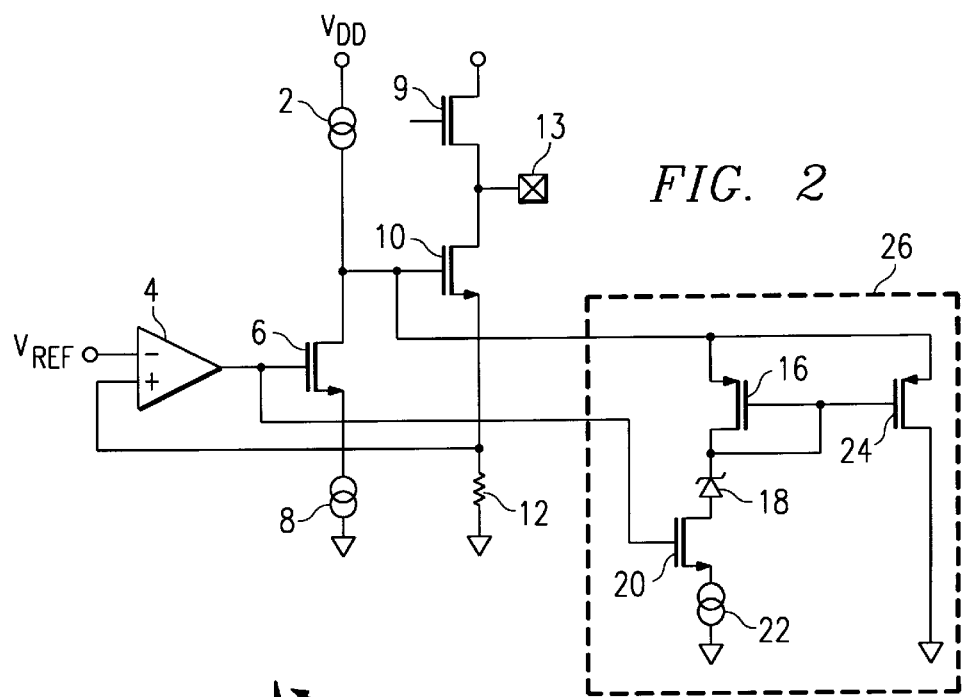
FIG. 2 is a low-side driver circuit with the preferred embodiment short circuit protection circuit.

A short circuit protection circuit constructed according to the preferred embodiment of the invention will now be described. Referring to FIG. 1, the short circuit protection circuit is made from a first short circuit protection circuit which is in parallel to a second short circuit protection circuit 26. In this figure, transistor 9 is a high-side driver and transistor 10 is the low-side driver.

The first short circuit protection circuit is constructed by connecting a first end of current source 2 to a Vdd voltage. The second end of current source 2 is connected to the gate of N-channel low-side driver 10 and to the drain of N-channel transistor 6. The source of low-side driver 10 is connected to a first end of sense resistor 12. The second end of sense resistor 12 is connected to ground. Comparator 4 has an inverting input connected to a reference voltage Vref and a noninverting input connected to the first end of sense resistor 12. The output of comparator 4 is connected to the gate of transistor 6. The source of transistor 6 is connected to the first end of current source 8. The second end of current source 8 is connected to ground.

The second short circuit protection circuit includes a current mirror (made from transistors 16 and 24), a Zener diode 18, an N-channel transistor 20, a current source 22, all connected in series. The second short circuit protection circuit is constructed by connecting the source of P-channel transistor 16 to the source of P-channel transistor 24 and to the gate of low-side driver 10. The drain of transistor 24 is connected to ground. The gate of transistor 24 is connected to the gate and drain of transistor 16 and to the cathode of Zener diode 18. The anode of diode 18 is connected to the drain of N-channel transistor 20. The gate of transistor 20 is connected to the output of comparator 4. The source of transistor 20 is connected to a first end of current source 22 whose second end is connected to ground.

In operation, the first and second short circuit protection circuits are designed to protect low-side driver 10 in the event of a short circuit condition. When node 13 is short circuited to a high voltage, an excessive amount of current will surge through low-side driver 10 and, therefore, through sense resistor 12. The surge in current through sense resistor 12 will induce a positive voltage proportional to the current surge. This voltage is sensed on the inverting input of comparator 4. When the voltage on sense resistor 12 exceeds the reference voltage Vref, the comparator will switch from a low voltage to a high voltage on the output thereby turning on transistor 6. This allows current 8 to discharge the gate of low-side driver 10 since current source 8 is larger than the current source 2. Additionally, transistor 20 in the second short circuit protection circuit 26 also turns on. By turning transistor 20 on, current source 22 activates current mirror created with transistors 16 and 24 through diode 18 such that additional current is drawn from the gate of low side driver 10. Current source 22 and the current mirror are design such that the current drawn through the current mirror is approximately 5–10 times larger than the current drawn through transistor 6 and current source 8.

In the preferred embodiment, the second short circuit protection circuit uses a 6 volt zener diode. The circuit sinks through the primary side of the current mirror the same current as through current source 8 and eight times more through the mirrored side of the current mirror. Using these values, the second short circuit protection circuit increases the turn-off of low-side driver transistor until the short circuit current is reduced to around 7 amps.

Figure 3:
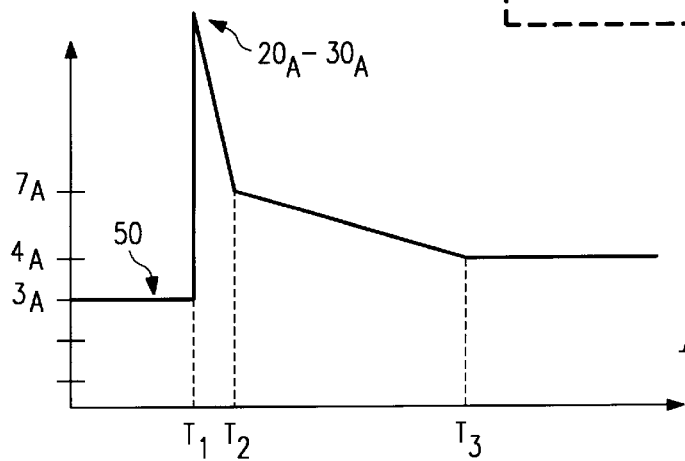

FIG. 3 shows the effect of having this second short circuit protection circuit in place. Waveform 50 shows the current going through low-side driver 10. From time 0 to $t_1$ the waveform shows 3 amps going through the low-side driver which would be typical for this embodiment. At $t_1$ the current waveform 50 increases to approximately 20–30 amps because of a short circuit condition. The time between $t_1$ and $t_2$ shows a rapid decrease in the current through low-side driver 10 due to the fact that the gate of low-side driver is being turned off by the first short circuit protection circuit and the second short circuit protection circuit. When the gate of low-side driver falls below the voltage drop of the current mirror plus the Zener diode. the second short circuit protection circuit 26 turns off and no longer contributes to the protection of low-side driver 10. So, from $t_2$ until $t_3$ the first short circuit protection circuit continues to control low-side transistor 10 until the circuit stabilizes at approximately 4 amps which would be considered a safe current for low-side transistor 10.

By utilizing this second short circuit protection circuit, the low-side driver is exposed to the high short circuit current of 20–30 amps for a much shorter period of time since the slew rate of the turn off is increased by 5–10 times. This benefit is achieved without decreasing the stability of the first short circuit protection circuit since it is not active in the voltage ranges where the first short circuit protection circuit becomes linear. Therefore, the disclosed invention provides the benefit of increasing the short circuit protection without decreasing the stability of the circuit.

Although the invention has been described and illustrated with a certain degree of particularity, it is understood that the present discloser has been made only by way of example, and that numerous changes in the combination and arrangement of the parts can be resorted to by those skilled in the art without departing from the spirit and scope of the invention, as hereinafter claimed.

We claim:

1. A protection circuit for protecting an electrical device, said protection circuit comprising:
   a first circuit, responsive to an affirmative detection of a current level in the electrical device exceeding a predetermined current level, for reducing the current level in the electrical device; and
   a second circuit, responsive to the affirmative detection of the current level in the electrical device exceeding the predetermined current level, for reducing the current level in the electrical device in parallel with the first circuit.

2. The protection circuit, as recited in claim 1, wherein the second circuit comprises:
   a current mirror operably coupled to the electrical device;
   a zener diode connected in series to a primary side of the current mirror;
   a transistor connected in series to the zener diode; and
   a current source connected in series to the transistor.

3. The protection circuit of claim 1, wherein:
   the first and second circuits reduce the current level in the electrical device by removing a charge appearing on a control node of the electrical device when activated.

4. The protection circuit of claim 3, wherein:
   the second circuit includes a current sink and a switch connected in series to the current sink to enable the current sink.

5. The protection circuit of claim 3, wherein:
   the second circuit is responsive to the charge level appearing on the control node of the electrical device.

6. The protection circuit of claim 5, wherein:
   the second circuit is activated to remove a charge appearing on the control node of the electrical device when the current level in the electrical device exceeds the predetermined current level and when the charge appearing on the control node of the electrical device exceeds a predetermined charge level.

7. The protection circuit of claim 6, wherein:
   the predetermined charge level is such that the second circuit is deactivated prior to deactivation of the first circuit.

8. The protection circuit of claim 3, wherein:
   the first and second circuits remove the charge appearing on the control node of the electrical device at different rates.

9. The protection circuit of claim 8, wherein:
   the second circuit removes the charge appearing on the control node of the electrical device at a greater rate than the rate at which the first circuit removes the charge appearing thereon.

10. A protection circuit for protecting an electrical device, comprising:
    a sensing circuit for detecting an electrical parameter relating to the operation of the electrical device;
    a first circuit, responsive to the sensing circuit, for controlling the operating characteristics of the electrical device; and
    a second circuit, responsive to the sensing circuit and the first circuit, for controlling the operating characteristics of the electrical device.

11. The protection circuit of claim 10, wherein:
    the first circuit and the second circuit control the operating characteristics of the electrical device by removing a charge appearing on a control node of the electrical device.

12. The protection circuit of claim 11, wherein:
    the first and second circuits have different periods of activation relative to each other.

13. The protection circuit of claim 11, wherein:
    the first circuit and the second circuit are connected in parallel relation to each other.

14. The protection circuit of claim 11, wherein:
    the first and second circuits remove the charge from the control node of the electrical device at different rates.

15. The protection circuit of claim 11, wherein:
    the second circuit is activated to remove the charge appearing on the control node of the electrical device while the charge exceeds a first predetermined value.

16. The protection circuit of claim 15, wherein:

the second circuit is activated to remove the charge appearing on the control node of the electrical device while the charge exceeds the first predetermined value and while the electrical parameter of the electrical device sensed by the sensing circuit exceeds a second predetermined value; and the first circuit is activated to remove the charge from the control node of the electrical device when the electrical parameter sensed by the sensing circuit exceeds the second predetermined value.

17. The protection circuit of claim 10, wherein:

the second circuit comprises a current sink operatively connected to a control node of the electrical device, and a third circuit for turning off the current sink based upon the sensing circuit and the operating characteristics of the first circuit.

18. The protection circuit of claim 17, wherein:

the current sink comprises a current mirror.

19. The protection circuit of claim 17, wherein:

the third circuit includes a current source and a switch coupled thereto.

20. A circuit for protecting an electrical device, comprising:

a sensing circuit for detecting a first electrical parameter relating to the operation of the electrical device;

a first circuit, responsive to the sensing circuit, for controlling the operating characteristics of the electrical device; and a second circuit, responsive to the sensing circuit and a second electrical parameter relating to the operation of the electrical device, for controlling the operating characteristics of the electrical device.

21. The circuit of claim 20, wherein:

the first circuit reduces a voltage appearing on a control node of the electrical device when the first electrical parameter relating to the operation of the electrical device exceeds a first predetermined value; and the second circuit reduces the voltage appearing on the control node of the electrical device when the voltage thereon exceeds a second predetermined value.

22. The circuit of claim 21, wherein:

the second circuit reduces the voltage appearing on the control node of the electrical device when the voltage thereon exceeds a second predetermined value and when the first electrical parameter relating to the operation of the electrical device exceeds the first predetermined value.

* * * * *